(12) United States Patent
Chen et al.

(10) Patent No.: US 7,516,058 B2
(45) Date of Patent: Apr. 7, 2009

(54) METHOD FOR IP CHARACTERIZATION AND PATH FINDING, AND COMPUTER READABLE RECORDING MEDIUM FOR STORING PROGRAM THEREOF

(75) Inventors: Peter Hanping Chen, Taoyuan County (TW); Chih-Fu Chien, Taipei (TW); Jyh-Herng Wang, Hsinchu County (TW); Hsu-Hui Tsai, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 626 days.

(21) Appl. No.: 10/711,472

(22) Filed: Sep. 21, 2004

(65) Prior Publication Data

US 2006/0062155 A1    Mar. 23, 2006

(51) Int. Cl.
G06F 17/50 (2006.01)
(52) U.S. Cl. .......... 703/14; 702/120; 714/741; 716/4
(58) Field of Classification Search ............ 703/14, 703/20; 714/738, 741; 702/57, 108, 119, 702/120; 370/250; 716/4, 17
See application file for complete search history.

(56) References Cited

U.S. PATENT DOCUMENTS

| | | | |
|---|---|---|---|
| 6,453,437 B1 * | 9/2002 | Kapur et al. | 714/741 |
| 6,678,645 B1 * | 1/2004 | Rajsuman et al. | 703/20 |
| 6,789,223 B2 * | 9/2004 | Fetherson | 714/738 |
| 7,124,342 B2 * | 10/2006 | Wang et al. | 714/741 |
| 2002/0188904 A1 * | 12/2002 | Chen et al. | 714/741 |
| 2004/0225459 A1 * | 11/2004 | Krishnaswamy et al. | 702/57 |

OTHER PUBLICATIONS

Zarrineh et al., K. System-on-chip testability using LSSD scan structures, IEEE Design & Test of Computers, vol. 18, May-Jun. 2001, pp. 83-97.*
Astrom et al., P. Application of Software design patterns to DSP library design, Proceedings of the 14th International Symposium on Systems Synthesis, Sep. 2001, pp. 239-243.*
Zorian et al., Testing embedded-core-based system chips, Computer, IEEE, vol. 32, Jun. 1999, pp. 52-60.*
Gupta et al., R.K. Introducing core-based system design, IEEE Design & Test of Computers, vol. 14, Oct.-Dec. 1997, pp. 15-25.*
Armstrong et al., J.R. VHDL Modeling and Model Testing for DSP Applications, IEEE Transactions on Industrial Electronics, vol. 46, No. 1, Feb. 1999, pp. 13-22.*

* cited by examiner

Primary Examiner—Russell Frejd
(74) Attorney, Agent, or Firm—Jianq Chyun IP Office

(57) ABSTRACT

IP characterization and for path finding methods, and a computer readable recording medium for storing program are provided. First, an Intellectual Property (IP) component is provided. Then, a plurality of test patterns for all paths in the IP component is automatically generated. The test patterns are then sequentially input into the IP component for simulation, and a plurality of corresponding simulation results is generated. Finally, an IP characteristic library is generated based on the simulation results.

21 Claims, 2 Drawing Sheets

METHOD FOR IP CHARACTERIZATION AND PATH FINDING, AND COMPUTER READABLE RECORDING MEDIUM FOR STORING PROGRAM THEREOF

BACKGROUND OF THE INVENTION

1. Field of the Invention

The present invention relates to a method applied in Electronic Design Automation (EDA), and more particularly, to a method for Intellectual Property (IP) component characterization and a method for path finding thereof.

2. Description of Related Art

Thanks to technology progress in computer science, electronics industry is rapidly growing now. For example, Electronic Design Automation (EDA) is a technique, which assists the development engineers to design and simulate the electronic circuitry by using the computing power of the computer system. Especially in developing the Integrated Circuit (IC), different kinds of automation tools had played a significant role in the works such as function verification, layout, electricity analysis, and IC simulation.

In addition, in order to follow the right trend of intensive circuitry and fulfill the requirement of reducing the product development time, how to develop a most economical chip product has become a major topic for development engineers now, and reusing of the circuitry design is one of the techniques to achieve this object. In other words, by applying this technique, various functional circuitries which are well designed can be repeatedly used to build up a new Application Specific Integrated Circuit (ASIC). Therefore, the development process of the IC product can be completed in a very short time period. Here, the well designed circuitry layout that can be repeatedly used is also known as an IP (Intellectual Property) component.

In general, an estimate data related to the IP component characteristic can be obtained at the same time when the IP component is being obtained. For instance, the information such as the maximum power consumption and the maximum delay time can be obtained from the developer designing the IP component. However, both of the electrical energy consumed in the circuitry and the delay time it outputs are varied based on different input. When using the IP component, the estimate data of the IP component provided originally is not good enough to accurately provide information related to its operating characteristic.

In the prior art, various test data are determined and provided by development engineers based on their own professional knowledge and working experience, and the test data are sequentially and manually input into the system with the help of a simulation program so as to obtain a report corresponding to each of the simulation results. Then, the key values (e.g. timing, power, etc.) it requires are manually extracted from the report of the simulation results, and the extracted key values are manually keyed in to generate an IP characteristic library which is used by subsequent development process. However, the paths in the IP component are very complicated, thus it is not feasible to manually determine test data for all paths in the IP component. Furthermore, for considering time efficiency, in the method of manually inputting the test data and cooperating with the simulation software to obtain the IP characteristic library, it is possible that only part of the test data are selected for simulation based on the physical requirements and the developer's experience, thus a complete IP characteristic library cannot be obtained.

SUMMARY OF THE INVENTION

Therefore, the present invention is directed to a method of IP characterization which can automatically test characteristics of all paths in the IP component so as to generate a complete IP characteristic library.

The present invention is directed to a method of finding path in IP component which can automatically find all paths in the IP component.

The present invention is directed to a computer readable recording media for storing program.

According to an embodiment of the present invention, first, an Intellectual Property (IP) component is provided. Then, a plurality of test patterns for all paths in the IP component is automatically generated. The test patterns are sequentially input into the IP component for simulation, and a plurality of corresponding simulation results is generated. Finally, an IP characteristic library is generated based on the simulation results.

According to an embodiment of the present invention, the step of automatically generating the plurality of test patterns for all paths in the IP component comprises: automatically finding all paths in the IP component; and generating a corresponding test pattern for each path.

The present invention is also directed to a method of finding paths in IP component. First, an Intellectual Property (IP) component is provided. Then, an ESD path is identified and excluded. If there is a path point, which was not previously searched, the path point is selected. Then, it is determined whether or not one path among the multiple paths of the selected path point has reached the end point of the path. A next path point, which is connected by the path of the selected path point is then searched by selecting a connection terminal of a transistor based on the transistor rule. In addition, a next path point, which is connected by the path of the selected path point is searched by selecting a connection terminal of a resistor based on the resistor rule.

According to an embodiment of the present invention, the method of finding paths in IP component further comprises: analyzing the type of all I/O ports in the IP component; and comparing each I/O port of the IP component with the I/O port information provided by the database. Wherein, the I/O port can be an input port, an output port or a bi-directional port. In addition, the method further comprises the step of excluding any path, which is input/output from any I/O port in the IP component and do not pass through any circuitry in the IP component.

The present invention is also directed to a computer readable recording media for storing a program implemented by a computer system, and the program comprises following instructions: reading an IP component; automatically generating a plurality of test patterns for all paths in the IP component; sequentially reading each of the test patterns for performing simulation on the IP component and generating a plurality of corresponding simulation results; and generating an IP characteristic library based on the simulation results.

Since the present invention can find all paths in the IP component automatically, a complete set of the test pattern can be determined for all paths, and simulation results for all paths can be further obtained, such that a complete IP characteristic library can be generated automatically. Since the IP characteristic library is automatically generated without any manual operation, not only a complete IP characteristic library for all paths can be generated, but also the time required for generating it is reduced.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF EMBODIMENTS

Figure 1:
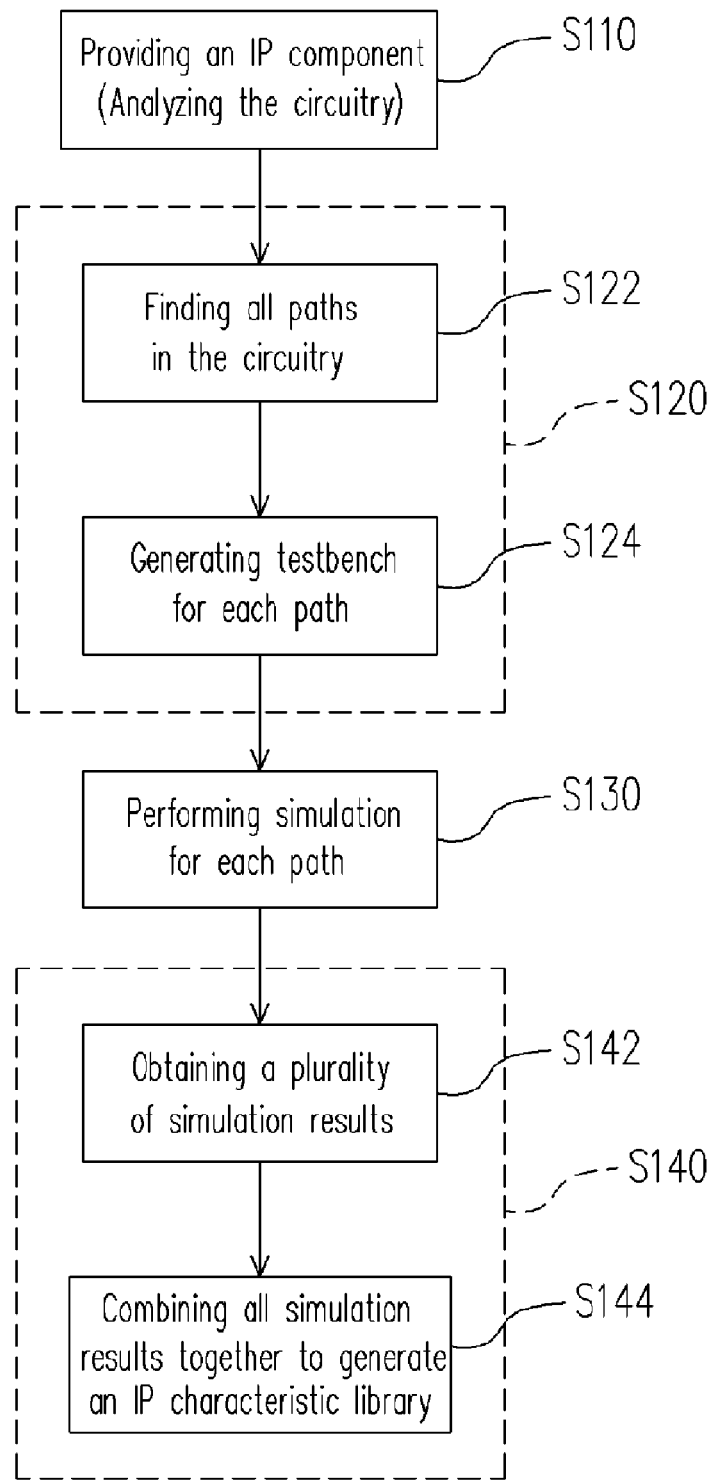
FIG. 1 is a flow chart illustrating a method of IP characterization according to an embodiment of the present invention.

FIG. 1 is a flow chart illustrating a method of IP characterization according to an embodiment of the present invention. Referring to FIG. 1, first, an IP component is provided and analyzed (step S110). Next, a plurality of corresponding test patterns for all paths in the IP component is automatically generated (step S120). Next, the test pattern generated (at step S120) is sequentially fed into the IP component for simulation to generate a plurality of corresponding simulation results (step S130). Finally, an IP characteristic library is generated based on the simulation results (step S140).

According to an embodiment of the present embodiment, the IP characteristic library mentioned above comprises the timing information and power information corresponding to each of the test patterns. Wherein, the IP component mentioned above is, for example, configured by a Hardware Description Language (HDL).

According to an embodiment of the present embodiment, step S120 comprises step S122 and step S124. At step S122, all paths in the IP component are searched automatically. Next, the process proceeds to step S124, in which the corresponding test bench for each path is generated.

Figure 2:
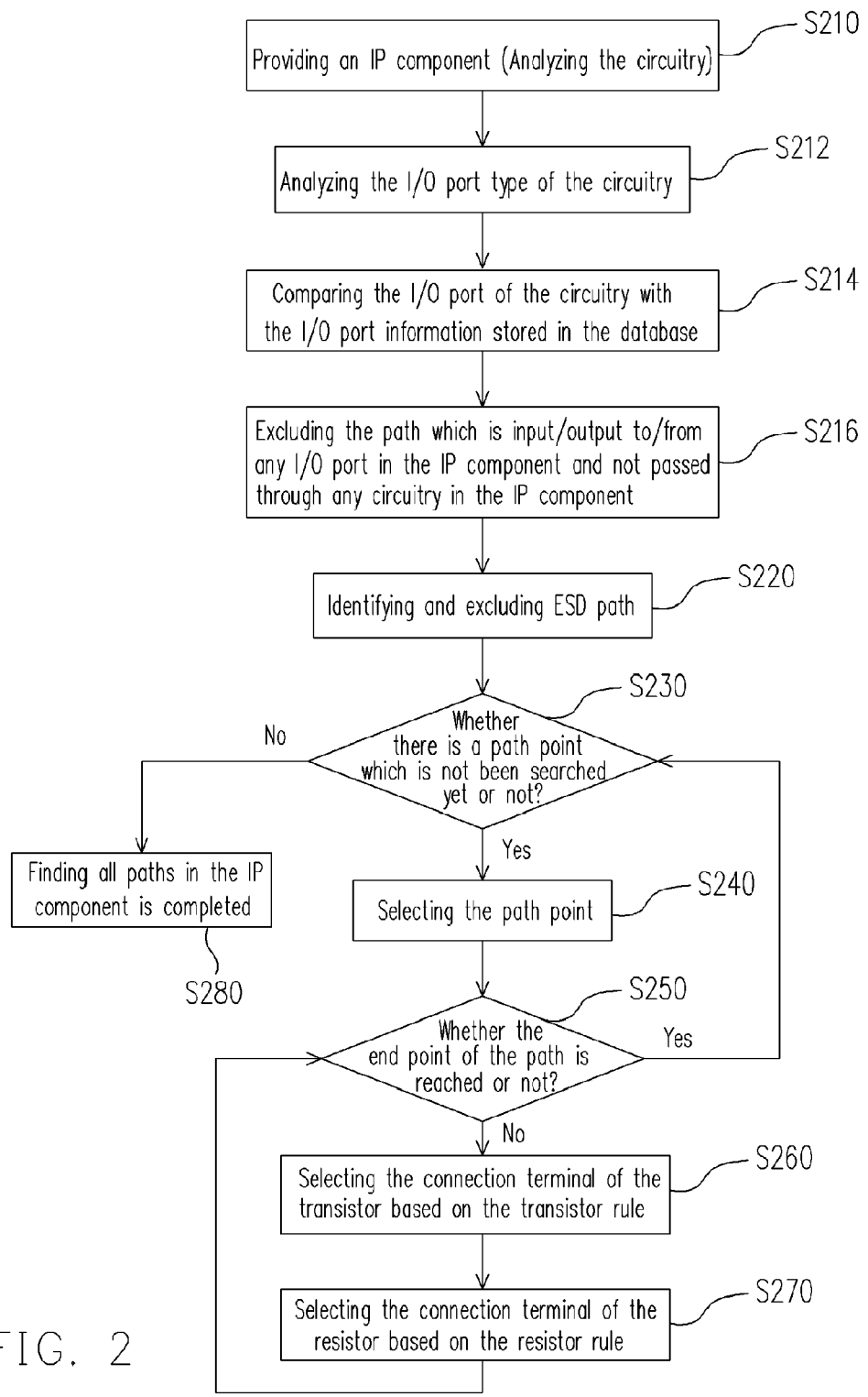
FIG. 2 is a flow chart illustrating a method of finding paths in IP component according to an embodiment of the present invention.

Here, step S122 may be implemented with reference to FIG. 2. FIG. 2 is a flow chart illustrating a method of finding paths in IP component according to an embodiment of the present invention. In such method, a breadth-first recursive algorithm is used to find all paths in the IP component, and the IP component is analyzed (step S210). In the present embodiment, since step S210 is the same as step S110, step S210 is omitted herein.

At step S212, the type of all I/O ports in the IP component is analyzed against a database. Wherein, the I/O port can be an input port, an output port, or a bi-directional port. Then, the process goes to step S214, in which the I/O port of the IP component is compared with the I/O port information stored in the database. Then in step S216, the path, which is input/output to/from any I/O port in the IP component and not passed through any circuitry in the IP component is excluded so as to prevent the bi-directional port from feeding through itself.

Next, an ESD path is identified and excluded (step S220). Since the ESD protection circuitry does not provide any function when it is normally operated, it is not required to search the ESD path. It is required for the ESD protection circuitry to lead in a great amount of current, thus the width of the ESD protection circuitry is rather wider. By using this characteristic, the ESD path can be easily identified and excluded.

Next, at step S230, whether there is a path point which has not been completely searched is determined. If all path points are searched, the step of finding all paths in the IP component is completed in step S280. Otherwise, the process proceeds to step S240, in which the path finding is performed on one of the path points, which had not been completely searched.

Next, at step S250, whether the path point currently found is an end point of this path is determined (here, whether it is the end point of this path or not is easily determined by configuring the end point of the IP component as VCC or GND in advance). If it is determined that the path point currently found is an end point of the path, the path finding of this path is completed, whether there is a path point which has not been completely searched is determined (step S230). If it is determined that the path point currently found is not the end point of the path, a next path point is then searched by selecting a connection terminal of the current path point based on the transistor rule (step S260) and based on the resistor rule (step S270). For example, if the tracked path is electrically coupled to a source of a MOS transistor (path point), it is known from the transistor rule that the signal input from the source cannot be output from the gate of the transistor, thus a drain of the MOS transistor is selected for tracking a next path point. Here, the breadth-first recursive algorithm is repeatedly used to perform the steps of S250~S270 until the path finding is totally completed.

Referring to FIG. 1, step S140, for example, comprises step S142 and step S144. In step S142, key data is extracted from each of the simulation results, respectively. In the present embodiment, for example, the timing information (e.g. delay time) and the power consumption information for present simulation are extracted from each of the simulation results. At step S144, the key data of each of the simulation results is integrated to generate a complete IP characteristic library.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method of IP characterization, comprising:
using a computer, providing an IP component;
automatically generating a plurality of test patterns for all paths in the IP component;
sequentially inputting the test patterns into the IP component for simulation, and outputting a plurality of corresponding simulation results; and
extracting at least one key data from each of the simulation results, respectively; and
integrating the at least one key data of each of the simulation results to generate an IP characteristic library.

2. The method of IP characterization of claim 1, wherein the step of automatically generating the plurality of test patterns for all paths in the IP component comprises:
automatically searching all of the paths in the IP component; and
generating the corresponding test patterns for each of the paths.

3. The method of IP characterization of claim 2, wherein the step of automatically searching all of the paths in the IP component comprises:
identifying and excluding an ESD path;
wherein if there is at least a path point which has not been completely searched, the path point is selected;
determining whether one of the paths of the selected path point reaches an end point of the path or not;

searching a next path point connected by one of the paths of the selected path point by selecting a connection terminal of a transistor based on a transistor rule; and searching a next path point connected by one of the paths of the selected path point by selecting a connection terminal of a resistor based on a resistor rule.

4. The method of IP characterization of claim 3, wherein the step of automatically searching all of the paths in the IP component further comprises:

analyzing a type of all of the I/O ports in the IP component; and comparing the I/O ports of the IP component with an I/O port information stored in a database.

5. The method of IP characterization of claim 4, wherein the type of the I/O ports comprises an input port, an output port and a bi-directional port.

6. The method for IP characterization of claim 3, wherein the step of automatically searching all of the paths in the IP component further comprises excluding any path which is input/output from any of the I/O ports in the IP component not passing through any circuitry in the IP component.

7. The method of IP characterization of claim 1, wherein the IP characteristic library comprises a plurality of timing information and a plurality of power information corresponding to the test patterns.

8. The method for IP characterization of claim 1, wherein the IP component is configured by a Hardware Description Language (HDL).

9. A method of finding paths in an IP component, comprising: using a computer, providing an IP component;

identifying and excluding an ESD path; wherein if there is at least a path point which has not been completely searched yet, the path point is selected;

determining whether or not one of the paths of the selected path point reaches an end point of the path;

searching a next path point connected by one of the paths of the selected path point by selecting a connection terminal of a transistor based on a transistor rule; and searching a next path point connected by one of the paths of the selected path point by selecting a connection terminal of a resistor based on a resistor rule.

10. The method of finding paths in an IP component of claim 9, further comprising: analyzing a type of all of the I/O ports in the IP component; and comparing the I/O ports of the IP component with an I/O port information stored in a database.

11. The method of finding paths in an IP component of claim 10, wherein a type of the I/O ports comprises an input port, an output port and a bi-directional port.

12. The method of finding paths in an IP component of claim 9, further comprising excluding any path which is input/output from any of the I/O ports in the IP component not passing through any circuitry in the IP component.

13. The method of finding paths in an IP component of claim 9, wherein the IP component is configured by a Hardware Description Language (HDL).

14. A computer readable storage medium having computer executable instructions, which when executed on a computer system, perform an IP characterization method on the computer system, the IP characterization method comprises:

reading an IP component;

automatically generating a plurality of test patterns for all paths in the IP component;

sequentially reading the test patterns for performing simulation on the IP component and generating a plurality of corresponding simulation results;

extracting at least one key data from each of the simulation results, respectively; and integrating the at least one key data of each of the simulation results to generate an IP characteristic library.

15. The computer readable storage medium of claim 14, wherein automatically generating the plurality of test patterns for all paths in the IP component comprises:

automatically searching all of the paths in the IP component; and generating the corresponding test patterns for each of the paths.

16. The computer readable storage medium of claim 15, wherein automatically searching all of the paths in the IP component comprises:

identifying and excluding an ESD path;

wherein if there is at least a path point which has not been completely searched, the path point is selected;

determining whether or not one of the paths of the selected path point reaches an end point of the path;

searching a next path point connected by one of the paths of the selected path point by selecting a connection terminal of a transistor based on a transistor rule; and searching a next path point connected by one of the paths of the selected path point by selecting a connection terminal of a resistor based on a resistor rule.

17. The computer readable storage medium of claim 16, wherein automatically searching all of the paths in the IP component further comprises:

analyzing a type of all of the I/O ports in the IP component; and comparing the I/O ports of the IP component with an I/O port information stored in a database.

18. The computer readable storage medium of claim 17, wherein a type of the I/O ports comprises an input port, an output port and a bi-directional port.

19. The computer readable storage medium of claim 16, wherein automatically searching all of the paths in the IP component further comprises excluding any path which is input/output from any of the I/O ports in the IP component and not passed through any circuitry in the IP component.

20. The computer readable storage medium of claim 14, wherein the IP characteristic library comprises a plurality of timing information and a plurality of power information corresponding to the test patterns.

21. The computer readable storage medium of claim 14, wherein the IP component is configured by a Hardware Description Language (HDL).

* * * * *